United States Patent
Aoyama

(10) Patent No.: US 12,333,369 B2
(45) Date of Patent: Jun. 17, 2025

(54) CIRCUIT MODULE AND RFID TAG

(71) Applicant: Murata Manufacturing Co., Ltd., Nagaokakyo (JP)

(72) Inventor: Yoshihiro Aoyama, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 106 days.

(21) Appl. No.: 17/901,324

(22) Filed: Sep. 1, 2022

(65) Prior Publication Data

US 2022/0414415 A1 Dec. 29, 2022

Related U.S. Application Data

(63) Continuation of application No. PCT/JP2020/036709, filed on Sep. 28, 2020.

(30) Foreign Application Priority Data

Mar. 24, 2020 (JP) .................................. 2020-052512

(51) Int. Cl.
*G06K 19/077* (2006.01)
(52) U.S. Cl.
CPC .............................. *G06K 19/07752* (2013.01)
(58) Field of Classification Search
CPC .......... G06K 19/07752; H01L 21/4867; H01L 23/544; H01L 2223/54426
See application file for complete search history.

(56) References Cited

U.S. PATENT DOCUMENTS

| 6,693,243 | B1 | 2/2004 | Oida et al. |
| 9,449,943 | B2* | 9/2016 | Lin ........................ H01L 21/568 |
| 11,421,316 | B2* | 8/2022 | Lianto ............... H01L 21/67115 |
| 2005/0001785 | A1* | 1/2005 | Ferguson .......... G06K 19/07752 |
| | | | 343/895 |
| 2005/0035924 | A1* | 2/2005 | Liu ................... G06K 19/07752 |
| | | | 343/895 |
| 2013/0176184 | A1 | 7/2013 | Dokai et al. |

(Continued)

FOREIGN PATENT DOCUMENTS

| JP | 2001156204 A | 6/2001 |
| JP | 2004103607 A | 4/2004 |

(Continued)

OTHER PUBLICATIONS

International Search Report issued for PCT/JP2020/036709, date of mailing Dec. 28, 2020.

*Primary Examiner* — Thien M Le
*Assistant Examiner* — Asifa Habib
(74) *Attorney, Agent, or Firm* — ArentFox Schiff LLP

(57) ABSTRACT

A circuit module is provide that includes a substrate including a first surface and a second surface that are opposite to each other, an IC mounted on the first surface of the substrate, a circuit disposed on the first surface and the second surface of the substrate with a conductor pattern obtained by heat curing of conductive paste, and connected between the IC and an external circuit, and a dummy conductor pattern obtained by heat curing of the conductive paste, disposed on at least one of the first surface and the second surface of the substrate, and configured to maintain a balance of the conductive paste on the first surface and the second surface of the substrate.

16 Claims, 13 Drawing Sheets

(56) References Cited

U.S. PATENT DOCUMENTS

| | | | |
|---|---|---|---|
| 2015/0084178 A1* | 3/2015 | Kim | H01L 25/065 |
| | | | 257/706 |
| 2016/0282608 A1* | 9/2016 | Kondo | H01L 23/3121 |
| 2016/0351419 A1* | 12/2016 | Lin | H01L 24/20 |
| 2017/0083804 A1 | 3/2017 | Kato et al. | |
| 2018/0019054 A1 | 1/2018 | Tenno | |
| 2018/0210337 A1* | 7/2018 | Wakita | H05K 1/09 |
| 2018/0211754 A1* | 7/2018 | Hattori | H01F 17/0013 |
| 2018/0293480 A1* | 10/2018 | Osamura | H04B 5/43 |
| 2019/0131029 A1* | 5/2019 | Matsuura | H01L 21/4867 |
| 2019/0311995 A1* | 10/2019 | Ranaweera | H01L 21/78 |
| 2020/0227315 A1* | 7/2020 | Park | H01L 21/0274 |
| 2021/0066201 A1* | 3/2021 | Son | H10K 59/131 |
| 2021/0313197 A1* | 10/2021 | Yamaguchi | H01L 21/4853 |
| 2022/0336341 A1* | 10/2022 | Shearer | H01L 23/49883 |
| 2023/0102345 A1* | 3/2023 | Armstrong | H01L 21/4807 |
| | | | 257/668 |
| 2023/0307378 A1* | 9/2023 | Xue | H01L 21/768 |
| 2023/0420269 A1* | 12/2023 | Minato | H01L 21/4867 |

FOREIGN PATENT DOCUMENTS

| | | | |
|---|---|---|---|
| WO | WO-2012137717 A1 * | 10/2012 | G06K 19/07786 |
| WO | 2016084658 A1 | 6/2016 | |
| WO | 2016163212 A1 | 10/2016 | |

\* cited by examiner

Comparative Example

CIRCUIT MODULE AND RFID TAG

CROSS REFERENCE TO RELATED APPLICATIONS

This application is a continuation of PCT Application No. PCT/JP2020/036709, filed Sep. 28, 2020, which claims priority to Japanese Patent Application No. 2020-052512, filed Mar. 24, 2020, the entire contents of each of which are hereby incorporated by reference in their entirety.

TECHNICAL FIELD

The present invention relates to a circuit module and an RFID (Radio Frequency IDentifier) tag including the circuit module.

BACKGROUND

International Publication No. 2016/084658 (hereinafter "Patent Literature 1") discloses an RFIC module to be coupled to a conductor that serves as an antenna. The RFIC module disclosed in Patent Literature 1 includes a substrate, an RFIC chip mounted in the substrate, and a matching circuit by a plurality of coils connected to the RFIC chip.

When the RFIC module having the structure disclosed in Patent Literature 1 is designed to be reduced in size and thickness, changes can occur in electrical characteristics, such as unwanted radiation and unwanted coupling due to the proximity of the plurality of coils included in the RFIC module. Moreover, the flatness of the substrate of the RFIC module tends to deteriorate. This is because it becomes difficult to balance a conductor pattern provided on main surfaces of the substrate that are opposite to each other as the substrate is reduced in size. In other words, in a step of forming the conductor pattern on the substrate, behavior such as contraction of the substrate and the conductor pattern becomes unbalanced between the first surface and second surface of the substrate, and the tendency for the substrate to warp to one side becomes significant. In addition, as the deviation of distribution of the density and sparsity of conductors in a plane direction is increased, partial deformation of the substrate becomes more significant.

The substrate of the RFIC module warps or deforms as described above, which may make it difficult to mount the RFIC module on the flexible substrate on which an antenna conductor pattern is provided and/or may cause a connection failure.

The above-described warpage and deformation of the substrate occurs not only in the RFIC module, but also in a general circuit module on which a circuit by a conductor pattern is provided on the substrate and an IC is mounted.

SUMMARY OF THE INVENTION

In view of the foregoing, exemplary embodiments of the present invention provide a circuit module that reduces warpage and deformation of a substrate, and also provide an RFID tag including the circuit module.

In an exemplary aspect, a circuit module is provided that includes a substrate including a first surface and a second surface that are opposite to each other, an IC mounted on the first surface of the substrate, a circuit disposed on the first surface and the second surface of the substrate with a conductor pattern obtained by heat curing of conductive paste, and connected between the IC and an external circuit, and a dummy conductor pattern obtained by heat curing of the conductive paste, provided on at least one of the first surface and the second surface of the substrate, and configured to balance the conductive paste on the first surface and the second surface of the substrate.

In addition, an RFID tag according to an exemplary aspect includes an antenna having two conductor patterns disposed on a flexible insulating film, and a circuit module mounted on the insulating film and connected to or combined with the antenna. Moreover, the circuit module includes a substrate including a first surface and a second surface that are opposite to each other, an RFIC mounted on the first surface of the substrate, an impedance matching circuit disposed on the first surface and the second surface of the substrate with a conductor pattern obtained by heat curing of conductive paste, and connected between the RFIC and an external circuit, and a dummy conductor pattern obtained by heat curing of the conductive paste, provided on at least one of the first surface and the second surface of the substrate, and configured to maintain balance of the conductive paste on the first surface and the second surface of the substrate.

According to another exemplary aspect, a circuit module is provided that reduces warpage and deformation of a substrate, and an RFID tag is provided that includes the circuit module.

Figure 3:
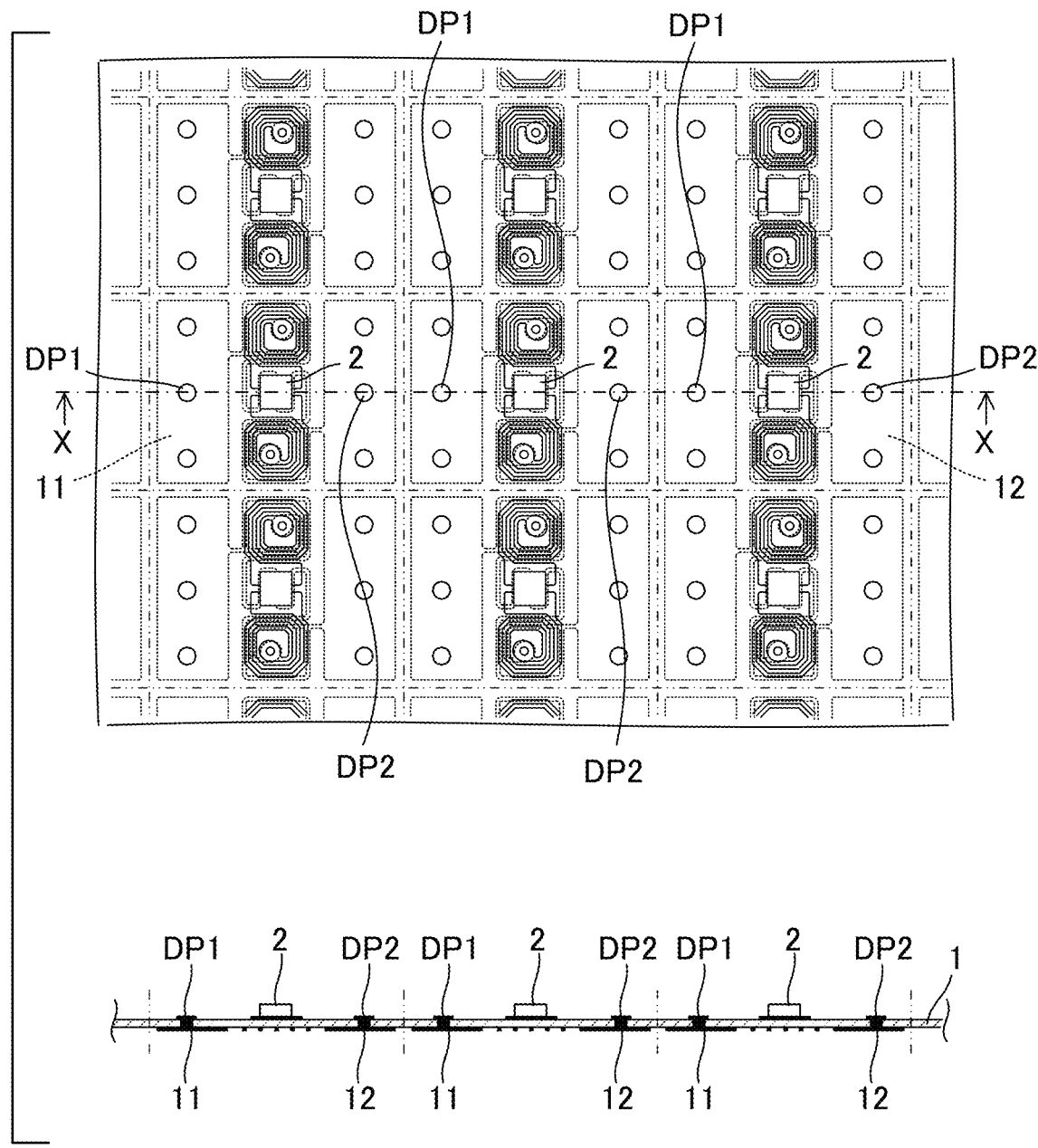

An upper portion of FIG. 3 is a plan view in a step of manufacturing the RFIC module 101, and a lower portion of FIG. 3 is a cross-sectional view taken along a line X-X line in the upper portion.

Figure 4:
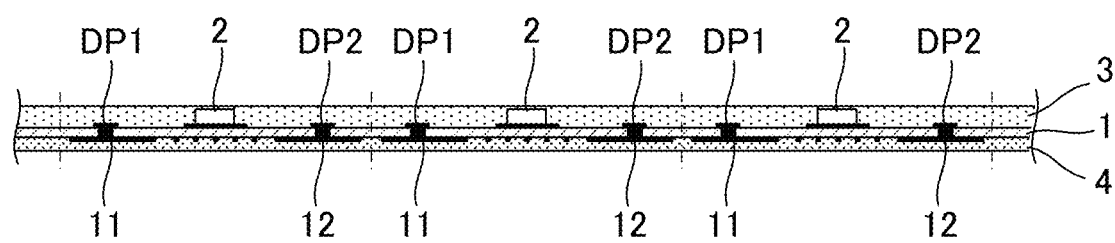

FIG. 4 is a cross-sectional view in a step after the step shown in FIG. 3.

Figure 5:
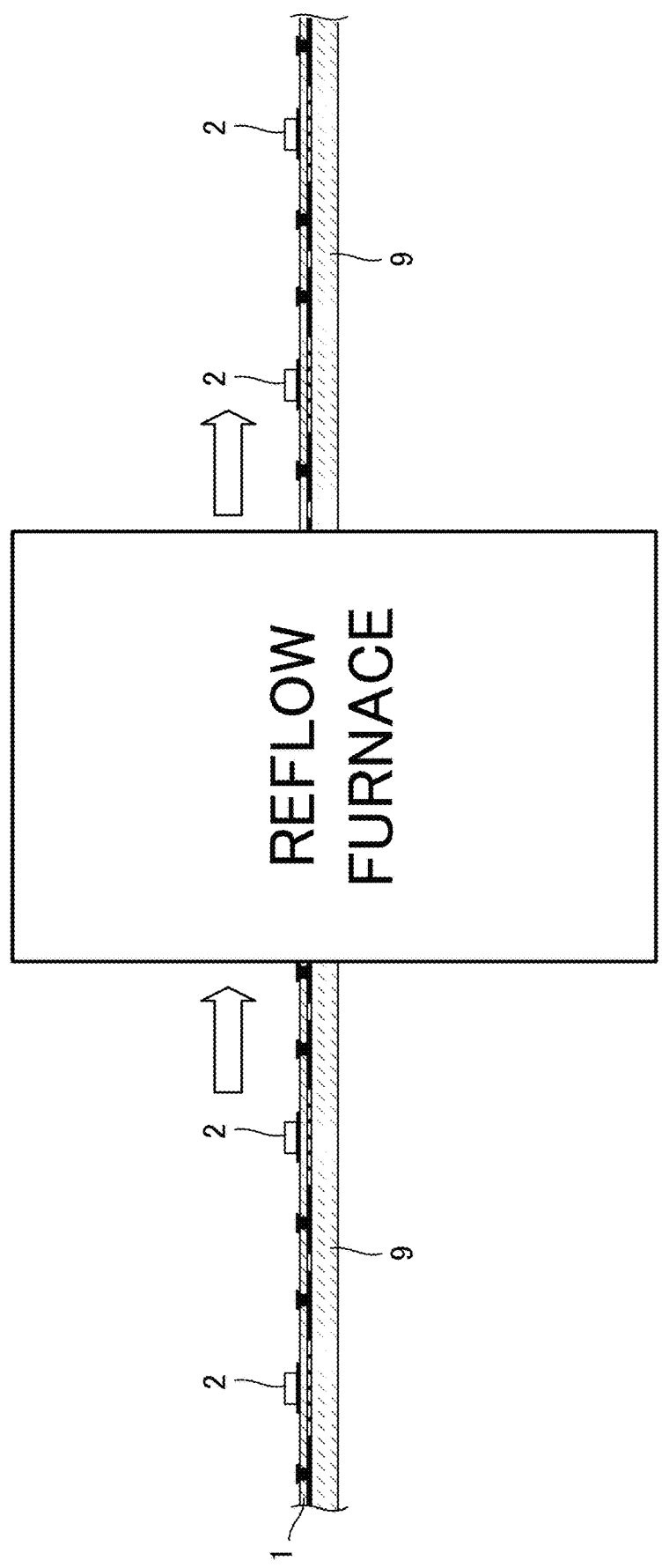

FIG. 5 is a schematic diagram showing a step of reflow soldering.

Figure 6A:
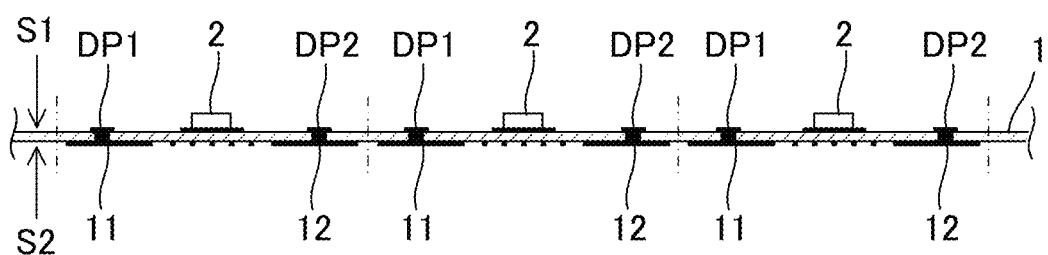
Figure 6B:
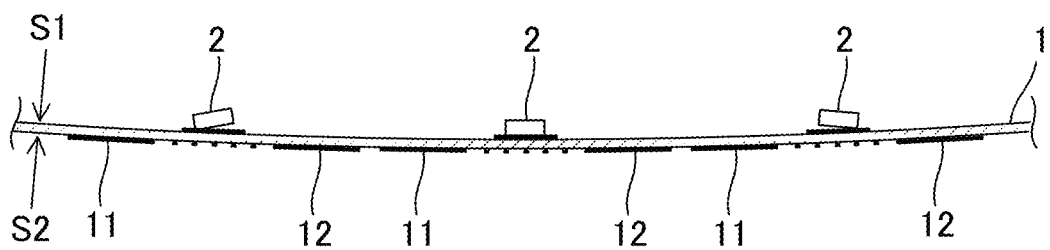

FIG. 6A is a cross-sectional view after reflow soldering of the RFIC module according to the present exemplary embodiment is performed. FIG. 6B is a cross-sectional view after reflow soldering of a conventional RFIC module as the comparative example is performed.

Figure 7:
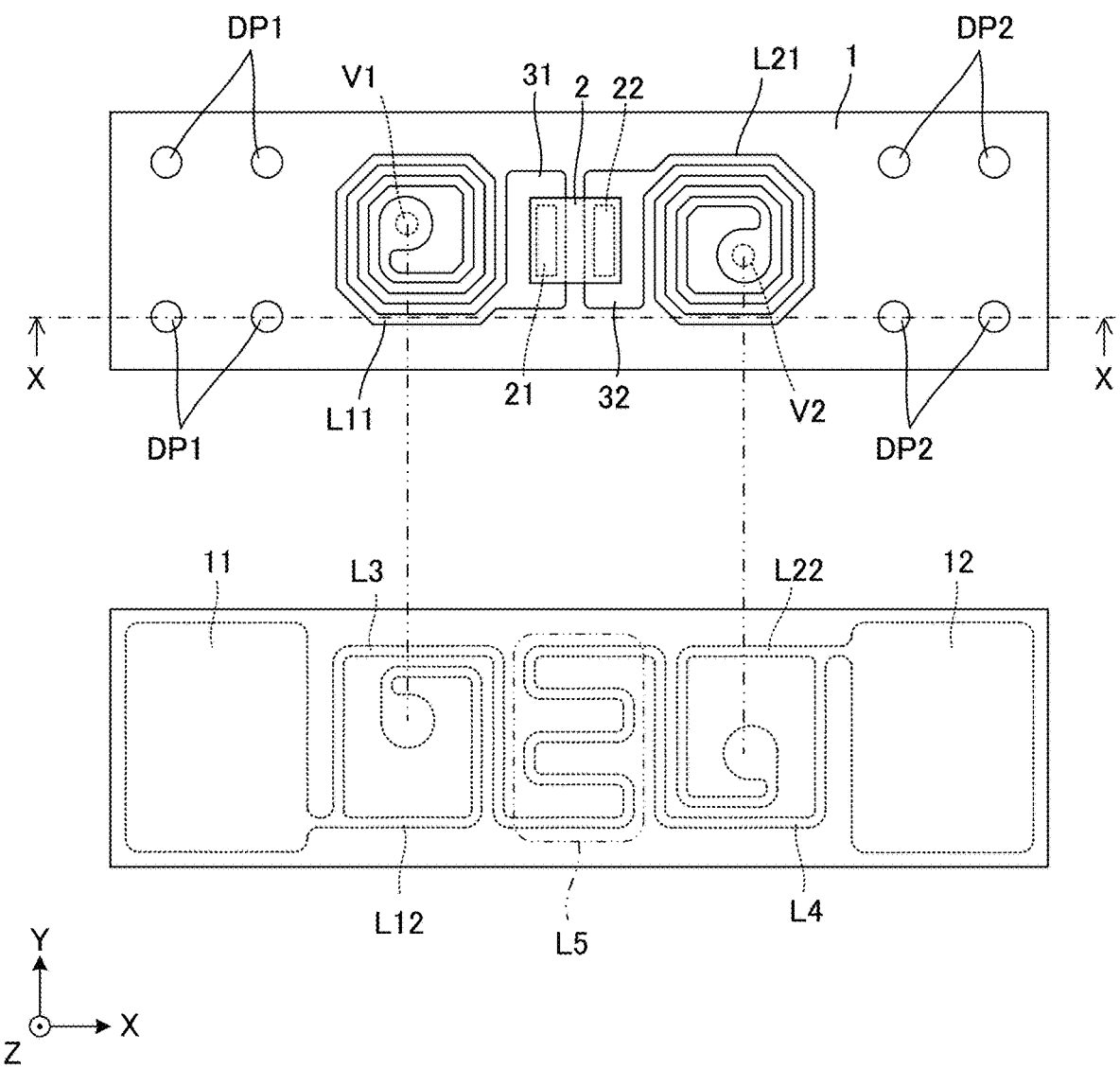

FIG. 7 is a plan view showing a conductor pattern provided on a substrate 1 of an RFIC module 102 according to a second exemplary embodiment.

Figure 8:
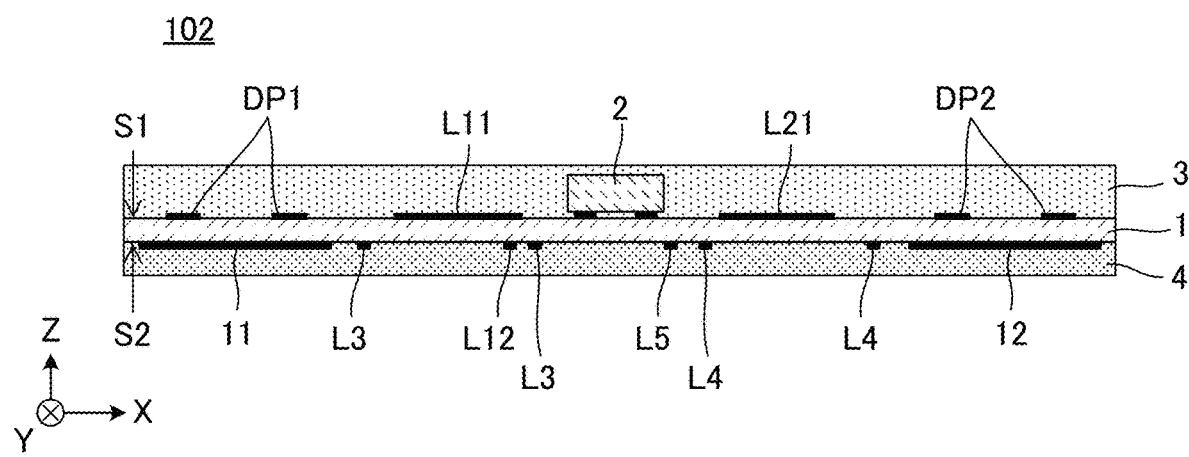

FIG. 8 is a cross-sectional view of the RFIC module 102, taken along a line X-X in FIG. 7.

Figure 9:
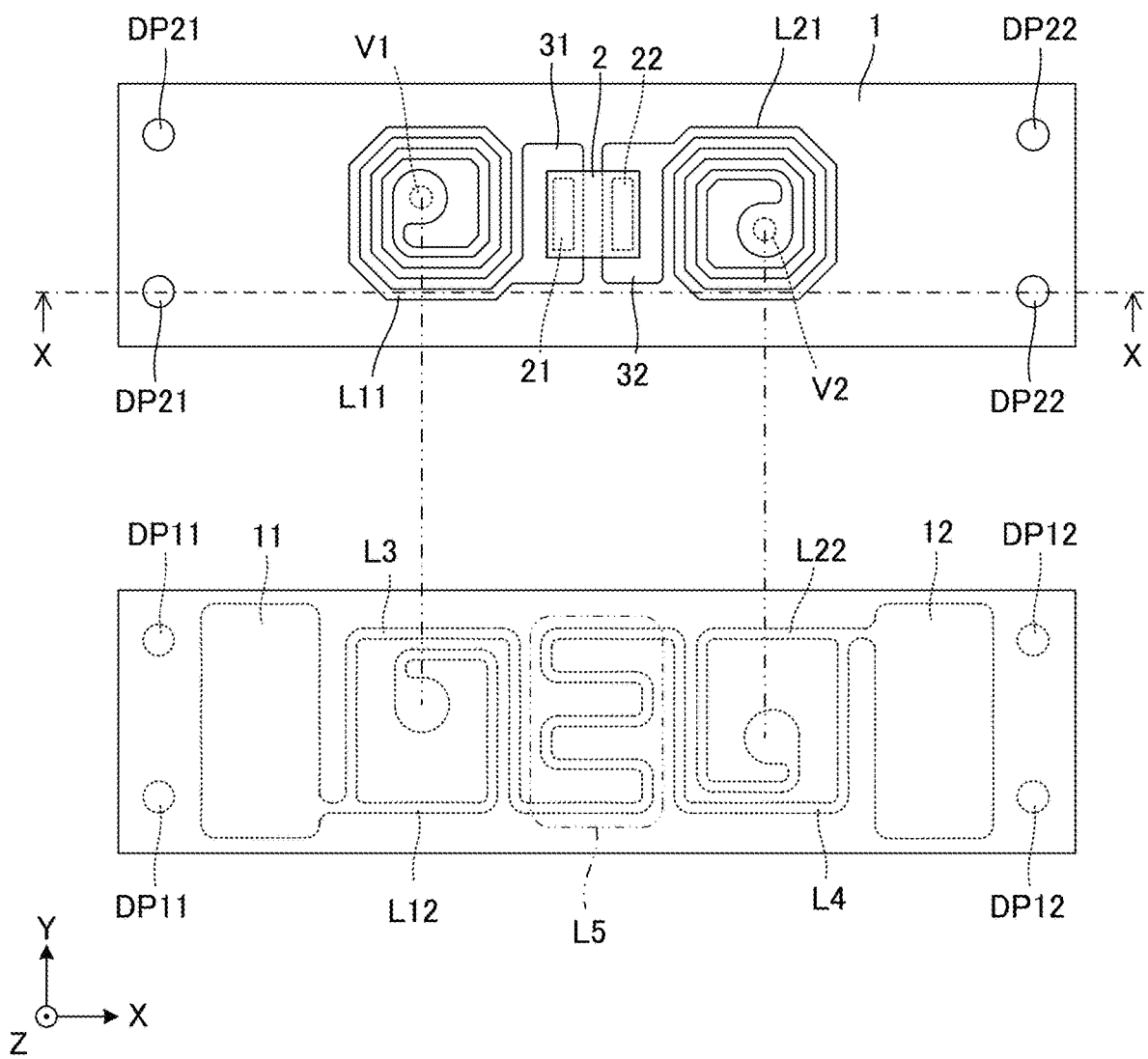

FIG. 9 is a plan view showing a conductor pattern provided on a substrate 1 of an RFIC module 103 according to a third exemplary embodiment.

Figure 10:
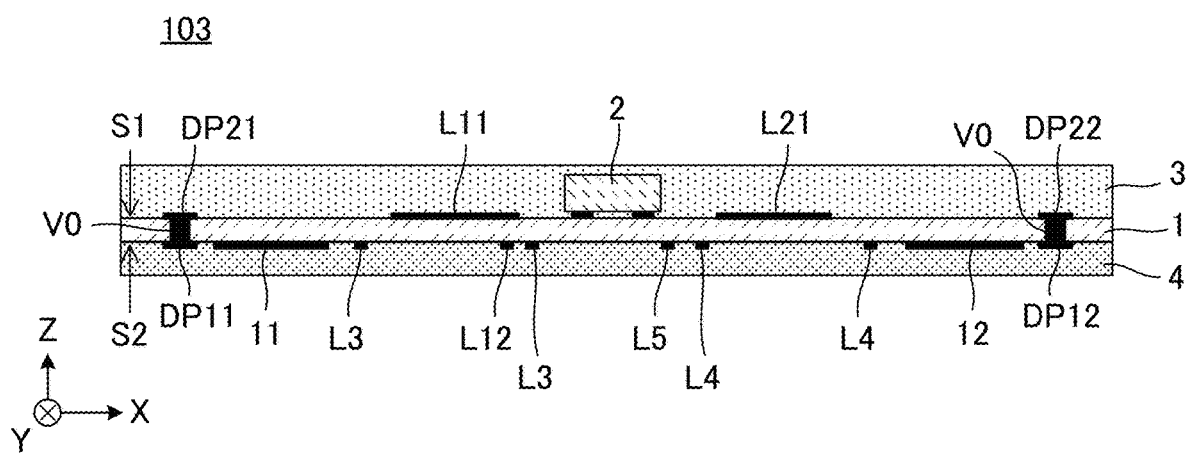

FIG. 10 is a cross-sectional view of the RFIC module 103, taken along a line X-X in FIG. 9.

Figure 11:
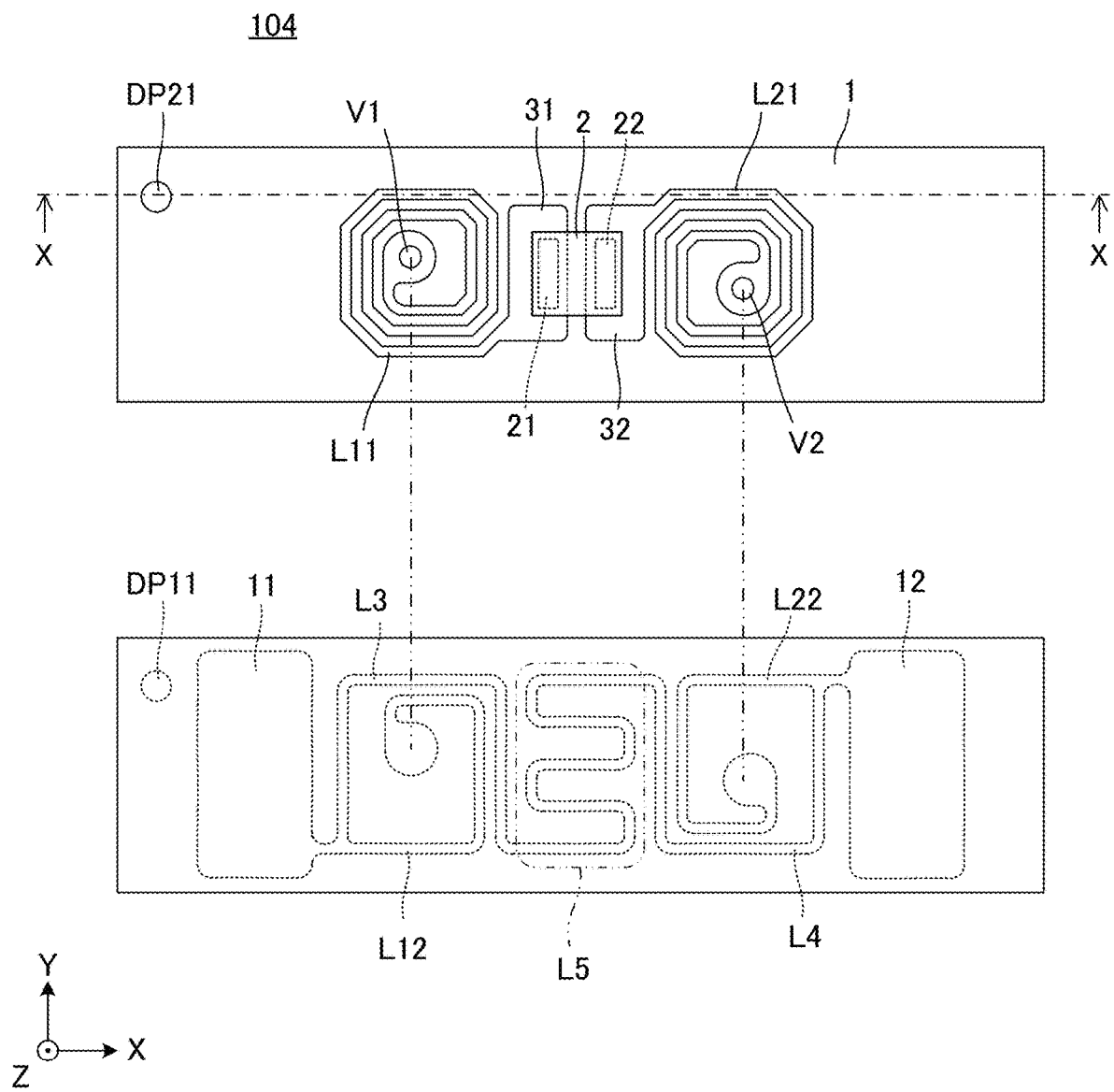

FIG. 11 is a plan view showing a conductor pattern provided on a substrate 1 of an RFIC module 104 according to a fourth exemplary embodiment.

Figure 12:
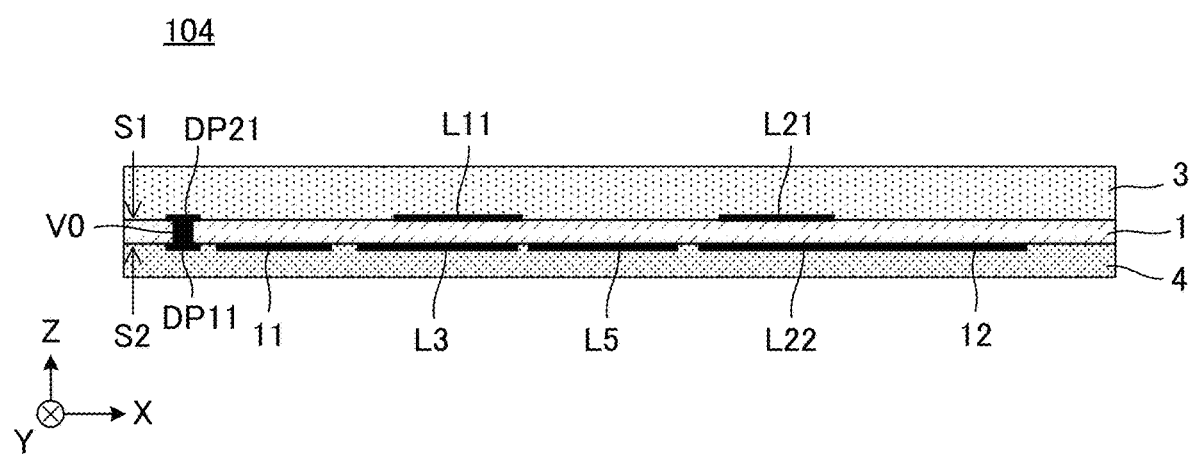

FIG. 12 is a cross-sectional view of the RFIC module 104, taken along a line X-X in FIG. 11.

Figure 13A:
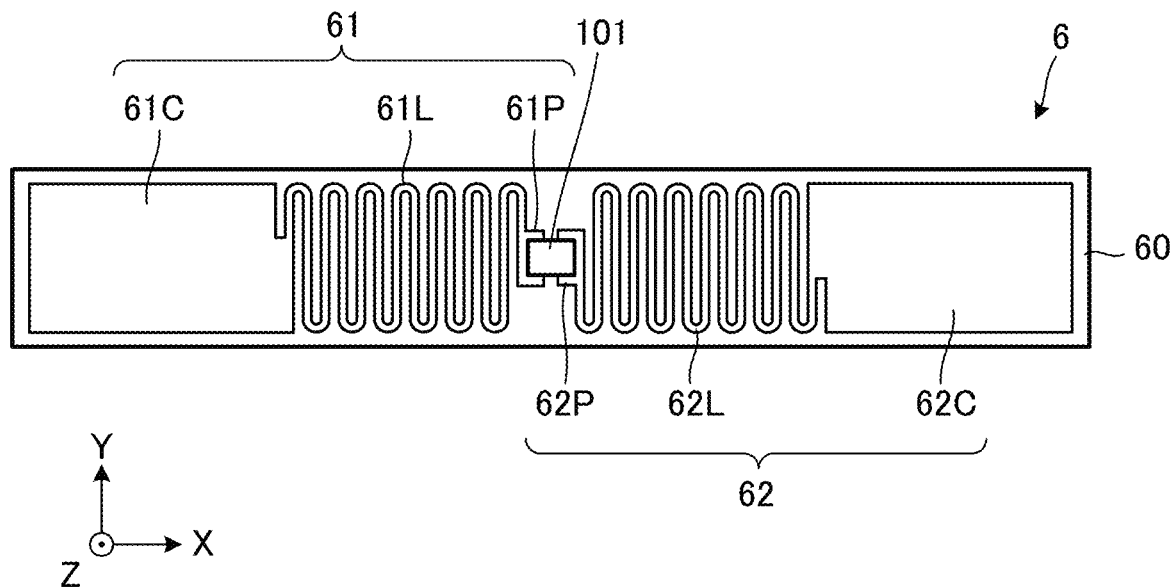
Figure 13B:
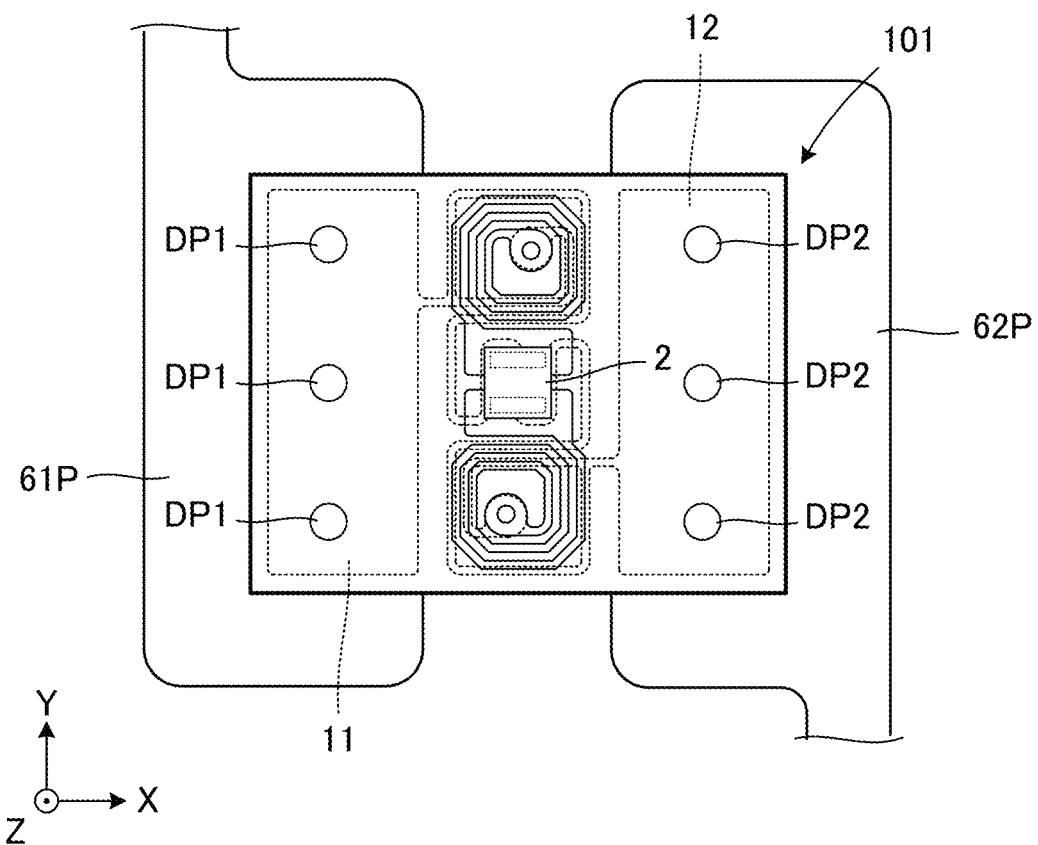

FIG. 13A is a plan view of an RFID tag 201 according to a fifth exemplary embodiment. FIG. 13B is an enlarged plan view of a portion on which an RFIC module 101 included in the RFID tag 201 is mounted.

DETAILED DESCRIPTION OF EXEMPLARY EMBODIMENTS

First Exemplary Embodiment

Figure 1:
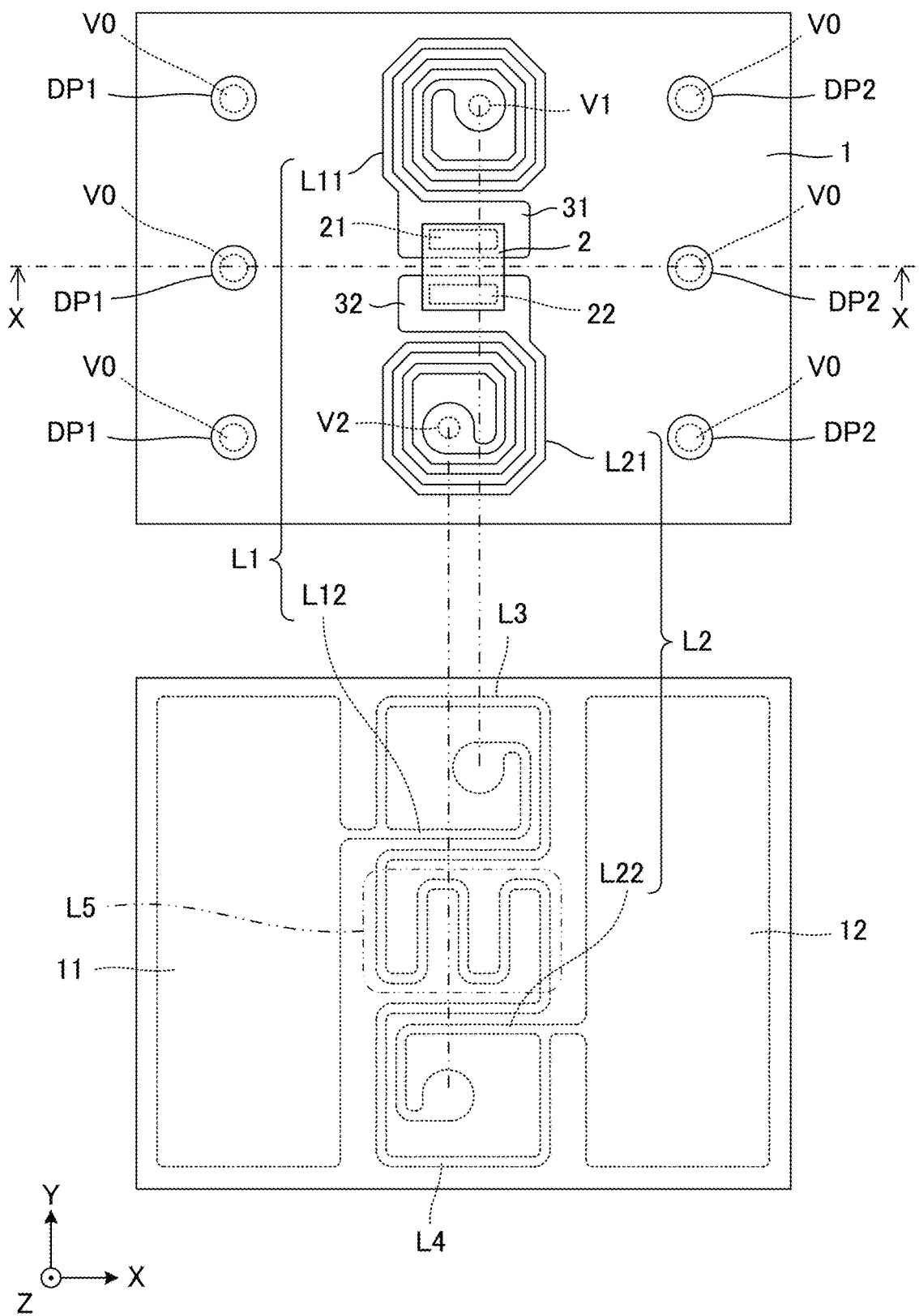
FIG. 1 is a plan view showing a conductor pattern provided on a substrate 1 of an RFIC module 101 according to a first exemplary embodiment.

FIG. 1 is a plan view showing a conductor pattern provided on a substrate 1 of an RFIC module 101 according to a first exemplary embodiment. In FIG. 1, an upper portion is a plan view of the conductor pattern provided on an upper surface of the substrate 1, and the lower portion of FIG. 1 is a plan view of the conductor pattern provided on a lower surface of the substrate 1.

In the exemplary aspect, the upper surface of the substrate 1 is provided with an RFIC side first terminal electrode 31, an RFIC side second terminal electrode 32, a conductor pattern L11 that is a main part (e.g., a first or primary part) of a first inductor L1, and a conductor pattern L21 that is a main part (e.g., a first or primary part) of a second inductor L2. The RFIC side first terminal electrode 31 is connected to a first end of the conductor pattern L11, and the RFIC side second terminal electrode 32 is connected to a first end of the conductor pattern L21. Furthermore, the upper surface of the substrate 1 is provided with a plurality of dummy conductor patterns DP1 and DP2. These conductor patterns are patterns formed by heat curing of conductive paste in the exemplary aspect.

The lower surface of the substrate 1 is provided with an antenna side first terminal electrode 11 and an antenna side second terminal electrode 12 that are capacitively coupled to conductor patterns of an antenna provided on another substrate. In addition, the lower surface of the substrate 1 is provided with a conductor pattern L12 that is a part of the first inductor L1, a conductor pattern L22 that is a part of the second inductor L2, a conductor pattern of a third inductor L3, a conductor pattern of a fourth inductor L4, and a conductor pattern (i.e., a conductor pattern surrounded by a chain double-dashed line) of a fifth inductor L5. These conductor patterns are also patterns formed by heat curing of the conductive paste.

A first end of the conductor pattern L12 that is the part of the first inductor L1 and a first end of the conductor pattern of the third inductor L3 are connected to the antenna side first terminal electrode 11. Similarly, a first end of the conductor pattern L22 that is the part of the second inductor L2 and a first end of the conductor pattern of the fourth inductor L4 are connected to the antenna side second terminal electrode 12. The conductor pattern of the fifth inductor L5 is connected between a second end of the conductor pattern of the third inductor L3 and a second end of the conductor pattern of the fourth inductor L4.

A second end of the conductor pattern L12 of the first inductor L1 and a second end of the conductor pattern L11 of the main part of the first inductor L1 are connected to each other through an interlayer connection conductor V1. Similarly, a second end of the conductor pattern L22 of the second inductor L2 and a second end of the conductor pattern L21 of the main part of the second inductor L2 are connected to each other through an interlayer connection conductor V2. Furthermore, the dummy conductor pattern DP1 and the antenna side first terminal electrode 11 are connected to each other through an interlayer connection conductor V0, and the dummy conductor pattern DP2 and the antenna side second terminal electrode 12 are connected to each other through the interlayer connection conductor V0.

As further shown, an RFIC 2 is mounted on the RFIC side first terminal electrode 31 and the RFIC side second terminal electrode 32. In other words, a terminal 21 of the RFIC 2 is connected to the RFIC side first terminal electrode 31, and a terminal 22 of the RFIC 2 is connected to the RFIC side second terminal electrode 32.

The conductor pattern L11 of the first inductor L1 and the third inductor L3 are respectively provided on different (i.e., opposing) layers of the substrate 1, and are disposed in such a relationship as to have coil openings overlapping each other. Similarly, the conductor pattern L21 of the second inductor L2 and the fourth inductor L4 are respectively provided on different (i.e., opposing) layers of the substrate 1, and are disposed in such a relationship as to have coil openings overlapping each other. Then, the second inductor L2 and the fourth inductor L4, and the first inductor L1 and the third inductor L3 are disposed in such a positional relationship as to interpose a mounting position of the RFIC 2 along the surface of the substrate 1.

Figure 2:
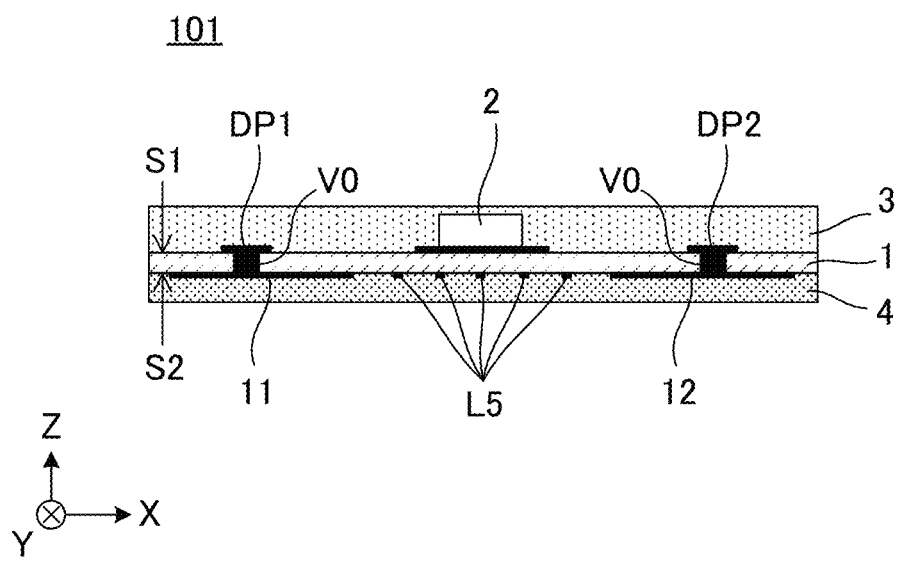
FIG. 2 is a cross-sectional view of the RFIC module 101, taken along a line X-X in FIG. 1.

FIG. 2 is a cross-sectional view of the RFIC module 101, taken along a line X-X in FIG. 1. This RFIC module 101 includes the substrate 1, and the RFIC 2 to be mounted on the substrate 1. The substrate 1 is, for example, a flexible substrate including polyimide or the like. The upper surface (e.g., a first surface S1) of the substrate 1 on which the RFIC 2 is mounted is covered with a protective film 3. The protective film 3 may include a hot melt agent, such as elastomer such as polyurethane and ethylene vinyl acetate (EVA), for example, or a thermosetting resin. Moreover, the lower surface (e.g., a second surface S2) of the substrate 1 is provided with a coverlay film 4. The coverlay film 4 is, for example, a polyimide film. Therefore, all of the substrate 1, the protective film 3, and the coverlay film 4 are flexible, and thus the RFIC module 101 as a whole is flexible according to the exemplary aspect.

As further shown, the dummy conductor patterns DP1 and DP2 on the first surface S1 of the substrate 1 are provided at a position facing the antenna side first terminal electrode 11 and the antenna side second terminal electrode 12 on the second surface S2 of the substrate 1 so as to interpose the substrate 1.

The upper portion of FIG. 3 is a plan view in a step of manufacturing the RFIC module 101, and the lower portion of FIG. 3 is a cross-sectional view taken along a line X-X line in the upper portion. FIG. 4 is a cross-sectional view in a step after the step shown in FIG. 3.

In an exemplary aspect, the RFIC module 101 is manufactured by the following steps.

(1) As shown in FIG. 3, an antenna side first terminal electrode 11, an antenna side second terminal electrode 12, and conductor patterns such as dummy conductor patterns DP1 and DP2 are provided on a wide and elongated substrate 1. These conductor patterns are provided by screen-printing copper paste on the substrate 1 and curing the copper paste by heating.

(2) Solder paste is then screen-printed at a position at which the RFIC 2 is mounted.

(3) The RFIC 2 is mounted thereon, and reflow soldering is performed.

(4) As shown in FIG. 4, the coverlay film 4 is attached or provided on the lower surface of the substrate 1.

(5) As shown in FIG. 4, the protective film 3 is covered or provided on the upper surface of the substrate 1.

(6) Finally, the substrate is divided into each RFIC module unit.

Conventionally, during the reflow soldering in the above step (3), in a case of different shrinkage rates on the first surface S1 and the second surface S2 of the substrate 1, the substrate 1 may become warped.

FIG. 5 is a schematic diagram showing a step of the reflow soldering. The RFIC 2 is mounted on the substrate 1 placed on a support plate 9, and is subjected to reflow soldering by being passed through a reflow furnace.

FIG. 6A is a cross-sectional view after the reflow soldering of the RFIC module according to the present exemplary embodiment is performed. FIG. 6B is a cross-sectional view after the reflow soldering of a conventional RFIC module as the comparative example is performed.

In the example shown in FIG. 6B, a formation rate of the conductor pattern provided on the second surface S2 of the substrate 1 is higher than a formation rate of the conductor pattern provided on the first surface S1 of the substrate 1, so that, as shown in FIG. 6B, the substrate 1 warps with the first surface S1 being recessed and the second surface S2 being projected, in the step of reflow soldering. Therefore, the RFIC 2 is mounted while one terminal of the RFIC 2 is lifted.

According to the present exemplary embodiment, as shown in FIG. 6A, with the dummy conductor patterns DP1 and DP2 provided on the first surface S1 of the substrate 1, the formation rate of the conductor patterns on the second surface S2 of the substrate 1 is substantially equal to the formation rate of the conductor patterns on the first surface S1 of the substrate 1. Therefore, as shown in FIG. 6A, the substrate 1 does not warp and maintains flatness. That is, the dummy conductor patterns DP1 and DP2 help configure the substrate to maintain a flat shape so that the terminals 2 do not lift as shown in FIG. 6B in contrast.

Second Exemplary Embodiment

A second exemplary embodiment shows an RFIC module with a different configuration of a dummy conductor pattern from the configuration in the first exemplary embodiment.

FIG. 7 is a plan view showing a conductor pattern provided on a substrate 1 of an RFIC module 102 according to the second exemplary embodiment. In FIG. 7, an upper portion is a plan view of the conductor pattern provided on an upper surface of the substrate 1, and the lower portion of FIG. 7 is a plan view of the conductor pattern provided on a lower surface of the substrate 1.

As shown, the upper surface of the substrate 1 is provided with an RFIC side first terminal electrode 31, an RFIC side second terminal electrode 32, a conductor pattern L11 that is a main part of a first inductor L1, and a conductor pattern L21 that is a main part of a second inductor L2. The RFIC side first terminal electrode 31 is connected to a first end of the conductor pattern L11, and the RFIC side second terminal electrode 32 is connected to a first end of the conductor pattern L21. Furthermore, the first surface S1 of the substrate 1 is provided with a plurality of dummy conductor patterns DP1 and DP2. These conductor patterns are patterns formed by heat curing of conductive paste in the exemplary aspect.

The lower surface of the substrate 1 is provided with an antenna side first terminal electrode 11 and an antenna side second terminal electrode 12 that are capacitively coupled to conductor patterns of an antenna provided on another substrate. In addition, the lower surface of the substrate 1 is provided with a conductor pattern L12 that is a part of the first inductor L1, a conductor pattern L22 that is a part of the second inductor L2, a conductor pattern of a third inductor L3, a conductor pattern of a fourth inductor L4, and a conductor pattern of a fifth inductor L5. These conductor patterns are also patterns formed by heat curing of the conductive paste.

The RFIC 2 is mounted on the RFIC side first terminal electrode 31 and the RFIC side second terminal electrode 32.

FIG. 8 is a cross-sectional view of the RFIC module 102, taken along a line X-X in FIG. 7. The substrate 1 is, for example, a flexible substrate including polyimide or the like. The upper surface (e.g., the first surface S1) of the substrate 1 on which the RFIC 2 is mounted is covered with a protective film 3. The lower surface (e.g., the second surface S2) of the substrate 1 is provided with a coverlay film 4.

The dummy conductor patterns DP1 and DP2 on the first surface S1 of the substrate 1 are provided at a position facing the antenna side first terminal electrode 11 and the antenna side second terminal electrode 12 on the second surface S2 of the substrate 1 so as to interpose the substrate 1. Unlike the RFIC module 101 shown in the first exemplary embodiment, the dummy conductor patterns DP1 and DP2 are provided on the first surface S1 of the substrate 1 and are not connected to the antenna side first terminal electrode 11 nor the antenna side second terminal electrode 12. In short, the dummy conductor patterns are independent of and not in contact with other conductor patterns.

As shown in the present exemplary embodiment, even when an interlayer connection conductor is not connected to the dummy conductor patterns DP1 and DP2, the dummy conductor patterns DP1 and DP2 provided on the first surface S1 of the substrate 1 are able to make the formation rate of the conductor patterns provided on the second surface S2 of the substrate 1 and the formation rate of the conductor pattern provided on the first surface S1 of the substrate 1 substantially equal, which enables the substrate 1 to maintain flatness without warping after reflow soldering.

Third Exemplary Embodiment

A third exemplary embodiment shows an RFIC module with a different configuration of a dummy conductor pattern from the configuration in the first and second exemplary embodiments.

FIG. 9 is a plan view showing a conductor pattern provided on a substrate 1 of an RFIC module 103 according to the third exemplary embodiment. In FIG. 9, an upper portion is a plan view of the conductor pattern provided on an upper surface of the substrate 1, and the lower portion of FIG. 9 is a plan view of the conductor pattern provided on a lower surface of the substrate 1. In addition, FIG. 10 is a cross-sectional view of the RFIC module 103, taken along a line X-X in FIG. 9.

As shown, the first surface S1 of the substrate 1 is provided with a plurality of dummy conductor patterns DP21 and DP22. The second surface S2 of the substrate 1 is provided with a plurality of dummy conductor patterns DP11 and DP12. The dummy conductor pattern DP21 and the dummy conductor pattern DP11 are connected to each other through an interlayer connection conductor V0, and the dummy conductor pattern DP22 and the dummy conductor pattern DP12 are connected to each other through the interlayer connection conductor V0. Other configurations are the same as the configurations of the RFIC module 102 described in the second exemplary embodiment.

A conductor configured by the dummy conductor patterns DP11 and DP21 and the interlayer connection conductor V0 is a dummy conductor that is independent of other conductors. Similarly, a conductor configured by the dummy conductor patterns DP12 and DP22 and the interlayer connection conductor V0 is a dummy conductor independent of other conductors of the RFIC module 103.

As shown in the present exemplary embodiment, the dummy conductor patterns DP11, DP12, DP21, and DP22, even when being provided on both surfaces of the substrate 1, increase the rigidity of the substrate 1 by being provided with the interlayer connection conductor V0. Accordingly, a change (e.g., in shape) in the substrate 1 by reflow soldering is significantly reduced.

Fourth Exemplary Embodiment

A fourth exemplary embodiment illustrates an RFIC module having a dummy conductor pattern that functions as a directional identification mark.

In particular, FIG. 11 is a plan view showing a conductor pattern provided on a substrate 1 of an RFIC module 104 according to the fourth exemplary embodiment. In FIG. 11, an upper portion is a plan view of the conductor pattern provided on an upper surface of the substrate 1, and the lower portion of FIG. 11 is a plan view of the conductor pattern provided on a lower surface of the substrate 1. In addition, FIG. 12 is a cross-sectional view of the RFIC module 104, taken along a line X-X in FIG. 11.

As shown, the first surface S1 of the substrate 1 is provided with one or more dummy conductor patterns DP21. The second surface S2 of the substrate 1 is provided with one or more dummy conductor patterns DP11. Moreover, the dummy conductor pattern DP21 and the dummy conductor pattern DP11 are connected to each other through an interlayer connection conductor V0. Unlike the RFIC module 103 shown in the third exemplary embodiment, only one set of conductors configured by the dummy conductor patterns DP21 and DP11 and the interlayer connection conductor V0 is provided. The set of conductors configured by these dummy conductor patterns DP21 and DP11 and the interlayer connection conductor V0 is provided at a position away from a region in which other original conductor patterns are provided. In other words, the conductor patterns provided on the substrate 1 are sparse and dense, and the set of conductors configured by the dummy conductor patterns DP21 and DP11 and the interlayer connection conductor V0 is disposed in a "sparse" region. Other configurations are the same as the configurations of the RFIC module 103 described in the third exemplary embodiment.

According to the present exemplary embodiment, with the dummy conductor patterns DP11 and DP21 and the interlayer connection conductor V0, the deviation in the plane direction of the distribution of the conductors in the substrate 1 is reduced. Accordingly, even after reflow soldering, the substrate 1 does not locally deform, and is configured to maintain flatness (i.e., a generally flat or plan shape).

In addition, according to the present exemplary embodiment, the protective film 3 is translucent, and the dummy conductor pattern DP21 is able to be captured from the outside, so that this dummy conductor pattern DP21 is able to be used as a mark to identify the orientation of the RFIC module 104.

Fifth Exemplary Embodiment

A fifth exemplary embodiment illustrates an RFID tag including an RFIC module.

FIG. 13A is a plan view of an RFID tag 201 according to the fifth exemplary embodiment. FIG. 13B is an enlarged plan view of a portion on which an RFIC module 101 included in the RFID tag 201 is mounted.

As shown, the RFID tag 201 includes an antenna 6, and an RFIC module 101 to be coupled to the antenna 6. The antenna 6 includes an insulating film 60, and conductor patterns 61 and 62 provided on this insulating film 60. The insulating film 60 is, for example, a polyethylene terephthalate (PET) film, and the conductor patterns 61 and 62 are, for example, aluminum foil patterns. The configurations of the RFIC module 101 are the same as the configurations described in the first exemplary embodiment.

According to the exemplary aspect, the conductor pattern 61 includes conductor patterns 61P, 61L, and 61C, and the conductor pattern 62 includes conductor patterns 62P, 62L, and 62C. The conductor patterns 61 and 62 define a dipole antenna in this configuration.

Moreover, the RFIC module 101 is adhered to the insulating film 60 of the antenna 6 with an insulating adhesive through an adhesive layer. The antenna side first terminal electrode 11 faces the conductor pattern 61P of the antenna 6 through the adhesive layer, and the antenna side second terminal electrode 12 faces the conductor pattern 62P of the antenna 6 through the adhesive layer. With this structure, the antenna side first terminal electrode 11 and the antenna side second terminal electrode 12 are respectively capacitively coupled to the conductor patterns 61P and 62P of the antenna 6.

According to the present exemplary embodiment, a state in which the RFIC 2 is mounted on the substrate of the RFIC module 101 is stable and the flatness of the RFIC module 101 is high, which makes it possible to obtain the RFID tag 201 with stable characteristics.

Lastly, it is generally noted that the description of the above exemplary embodiments is illustrative in all respects and it is not restrictive. Modifications and changes are able to appropriately be made by those skilled in the art.

For example, although the RFIC module is illustrated as a circuit module in each of the above described exemplary embodiments, the circuit module according to the present invention is applicable not only to the RFIC module but a module having a predetermined circuit function.

REFERENCE SIGNS LIST

DP1, DP2—dummy conductor pattern
DP11, DP12, DP21, DP22—dummy conductor pattern
L1—first inductor
L2—second inductor
L3—third inductor
L4—fourth inductor
L5—fifth inductor
L11, L12, L21, L22—conductor pattern
S1—first surface
S2—second surface
V0, V1, V2—interlayer connection conductor
1—substrate
2—RFIC
3—protective film
4—coverlay film
6—antenna
9—support plate
11—antenna side first terminal electrode
12—antenna side second terminal electrode
21, 22—terminal
31—RFIC side first terminal electrode
32—RFIC side second terminal electrode
60—insulating film
61, 62—conductor pattern
61P, 61L, 61C—conductor pattern
62P, 62L, 62C—conductor pattern
101, 102, 103, 104—RFIC module
201—RFID tag

The invention claimed is:

1. A circuit module comprising:
a substrate including a first surface and a second surface that oppose each other;
an integrated circuit (IC) disposed on the first surface of the substrate;
a circuit disposed on the first surface and the second surface of the substrate and having a conductor pattern obtained by heat curing of a conductive paste;
a dummy conductor pattern obtained by heat curing of the conductive paste; and
a terminal electrode that overlaps the dummy conductor pattern in a plan view of the first surface of the substrate,
wherein the dummy conductor pattern is independent of and not in contact with the conductor pattern, and
wherein the dummy conductor pattern is disposed on at least one of the first surface and the second surface of the substrate and is configured to maintain a balance of the conductive paste on the first surface and the second surface of the substrate.

2. The circuit module according to claim 1, wherein the circuit is connected between the IC and an external circuit.

3. The circuit module according to claim 1, wherein the dummy conductor pattern is connected to the terminal electrode through an interlayer connection conductor.

4. The circuit module according to claim 1, wherein the dummy conductor pattern is a identification mark.

5. The circuit module according to claim 1, wherein the dummy conductor pattern comprises a plurality of dummy conductor patterns disposed on the first surface of the substrate that face a pair of antenna side terminal electrodes disposed on the second surface of the substrate, respectively, so as to interpose the substrate therebetween.

6. The circuit module according to claim 5, wherein the plurality of dummy conductor patterns are not connected to and independent of the pair of antenna side terminal electrodes.

7. The circuit module according to claim 1, wherein the dummy conductor pattern configures the substrate to maintain a flat shape.

8. A circuit module comprising:
a substrate including a first surface and a second surface that oppose each other;
an integrated circuit (IC) disposed on the first surface of the substrate;
a circuit disposed on the first surface and the second surface of the substrate and having a conductor pattern formed from a conductive paste;
a dummy conductor pattern formed from the conductive paste; and
a terminal electrode that overlaps the dummy conductor pattern in a plan view of the first surface of the substrate,
wherein the dummy conductor pattern is independent of and not in contact with the conductor pattern, and
wherein the dummy conductor pattern is disposed on at least one of the first surface and the second surface of the substrate and is configured to balance the conductive paste on the first surface and the second surface of the substrate.

9. The circuit module according to claim 8, wherein the circuit is connected between the IC and an external circuit.

10. The circuit module according to claim 8, wherein the dummy conductor pattern is connected to the terminal electrode through an interlayer connection conductor.

11. The circuit module according to claim 8, wherein the dummy conductor pattern is a identification mark.

12. The circuit module according to claim 8, wherein the dummy conductor pattern comprises a plurality of dummy conductor patterns disposed on the first surface of the substrate that face a pair of antenna side terminal electrodes disposed on the second surface of the substrate, respectively, so as to interpose the substrate therebetween.

13. The circuit module according to claim 12, wherein the plurality of dummy conductor patterns are not connected to and independent of the pair of antenna side terminal electrodes.

14. The circuit module according to claim 8, wherein the dummy conductor pattern configures the substrate to maintain a flat shape.

15. An RFID tag comprising:
an antenna including two conductor patterns disposed on a flexible insulating film; and
a circuit module disposed on the insulating film, and connected to or combined with the antenna, the circuit module including:
a substrate including a first surface and a second surface that oppose each other;
an RFIC disposed on the first surface of the substrate;
an impedance matching circuit disposed on the first surface and the second surface of the substrate and having a conductor pattern obtained by heat curing of a conductive paste;
a dummy conductor pattern obtained by heat curing of the conductive paste; and
a terminal electrode that overlaps the dummy conductor pattern in a plan view of the first surface of the substrate,
wherein the impedance matching circuit is connected between the RFIC and an external circuit,
wherein the dummy conductor pattern is independent of and not in contact with the conductor pattern, and
wherein the dummy conductor pattern is disposed on at least one of the first surface and the second surface of the substrate and is configured to maintain a balance of the conductive paste on the first surface and the second surface of the substrate.

16. The RFID tag according to claim 15, further comprising:
an interlayer connection conductor electrically connected to the dummy conductor pattern;
wherein the dummy conductor pattern is connected to the terminal electrode through the interlayer connection conductor.

* * * * *